United States Patent
Pellizzer

(10) Patent No.: US 9,620,713 B2
(45) Date of Patent: Apr. 11, 2017

(54) MEMORY CELLS FORMED WITH SEALING MATERIAL

(71) Applicant: Micron Technology, Inc., Boise, ID (US)

(72) Inventor: Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/820,046

(22) Filed: Aug. 6, 2015

(65) Prior Publication Data
US 2015/0357565 A1    Dec. 10, 2015

Related U.S. Application Data

(62) Division of application No. 13/369,654, filed on Feb. 9, 2012, now Pat. No. 9,136,307.

(51) Int. Cl.
*H01L 45/00* (2006.01)
*H01L 27/24* (2006.01)

(52) U.S. Cl.
CPC .......... *H01L 45/16* (2013.01); *H01L 27/2427* (2013.01); *H01L 27/2481* (2013.01); *H01L 45/06* (2013.01); *H01L 45/1233* (2013.01); *H01L 45/1253* (2013.01); *H01L 45/144* (2013.01); *H01L 45/1675* (2013.01)

(58) Field of Classification Search
CPC ................................ H01L 27/24; H01L 21/62
See application file for complete search history.

(56) References Cited

U.S. PATENT DOCUMENTS

| 7,678,606 | B2 | 3/2010 | Chen |
| 7,893,421 | B2 | 2/2011 | Lee et al. |
| 7,982,261 | B2 * | 7/2011 | Kidoh ................. H01L 27/0688 257/314 |
| 2008/0315359 | A1 | 12/2008 | Happ et al. |
| 2009/0004786 | A1 * | 1/2009 | Radigan .............. H01L 27/1021 438/128 |

(Continued)

OTHER PUBLICATIONS

Chiapetta, Marco. "Intel and Numonyx Unveil Stacked, Cross Point Phase Change Memory", HotHardware.com, Oct. 28, 2009, <http://hothardware.com/News/Intel-and-Numonyx-Unveil-Stacked-Cross-Point-Phase-Change-Memory/> (3 pp.).

(Continued)

*Primary Examiner* — John C Ingham
*Assistant Examiner* — Ismail Muse
(74) *Attorney, Agent, or Firm* — Brooks, Cameron & Huebsch, PLLC

(57) ABSTRACT

Memory cells, arrays of memory cells, and methods of forming the same with sealing material on sidewalls thereof are disclosed herein. One example of forming a memory cell includes forming a stack of materials, forming a trench to a first depth in the stack of materials such that a portion of at least one of the active storage element material and the active select device material is exposed on sidewalls of the trench. A sealing material is formed on the exposed portion of the at least one of the active storage element material and the active select device material and the trench is deepened such that a portion of the other of the at least one of the active storage element material and the active select device material is exposed on the sidewalls of the trench.

20 Claims, 8 Drawing Sheets

(56) References Cited

U.S. PATENT DOCUMENTS

| | | | |
|---|---|---|---|
| 2009/0121317 A1* | 5/2009 | Lee | H01L 28/91 257/532 |
| 2009/0194813 A1* | 8/2009 | Fujimoto | H01L 27/101 257/330 |
| 2009/0316473 A1 | 12/2009 | Happ et al. | |
| 2010/0012918 A1* | 1/2010 | Parkinson | H01L 27/2409 257/5 |
| 2010/0109065 A1* | 5/2010 | Oh | H01L 27/0688 257/314 |
| 2010/0163817 A1* | 7/2010 | Savransky | H01L 27/2427 257/2 |
| 2010/0163822 A1 | 7/2010 | Ovshinsky et al. | |
| 2010/0184259 A1* | 7/2010 | Radigan | H01L 27/1021 438/129 |
| 2011/0186797 A1* | 8/2011 | Herner | G11C 17/16 257/2 |
| 2011/0278528 A1 | 11/2011 | Lung et al. | |
| 2012/0052651 A1* | 3/2012 | Lowrey | G11C 5/02 438/381 |
| 2013/0256624 A1* | 10/2013 | Kau | H01L 45/16 257/4 |

OTHER PUBLICATIONS

"Intel Reports Breakthrough in Stacked, Cross Point Phase Memory Technology", PHYSorg.com, Oct. 29, 2009, <http://www.physorg.com/news176064260.html> (1 pp.).

Kau, Derchang et al. "A stackable cross point phase change memory", Electron Devices Meeting (IEDM), 2009 IEEE International, Dec. 7-9, 2009 (4 pp.).

"Numonyx and Intel Achieve Stacked, Cross Point Phase Change Memory Milestone", ProfessorMemory.edn.com, Oct. 28, 2009, <http://www.professormemory.edn.com/blog/professor-memory-blog/numonyx-and-intel-achieve-stacked-cross-point-phase-change-memory-milesto> (1 pp.).

"Unity Semiconductor- Cross-point Array", Unitysemi.com, accessed Nov. 7, 2011, <http://www.unitysemi.com/our-technology-cross-point-array.html> (2 pp.).

\* cited by examiner

_US 9,620,713 B2_

MEMORY CELLS FORMED WITH SEALING MATERIAL

PRIORITY INFORMATION

This application is a Divisional of U.S. application Ser. No. 13/369,654 filed Feb. 9, 2012, the specification of which is incorporated herein by reference.

TECHNICAL FIELD

The present disclosure relates generally to semiconductor memory cells and methods, and, more particularly, to memory cell and memory cell formation methods using sealing material.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include resistive random access memory (RRAM) cells, phase change random access memory (PCRAM) cells, conductive bridge random access memory (CBRAM) cells, and/or spin transfer torque random access memory (STT-RAM) cells, among other types of memory cells.

Various resistive memory cells include a select device, e.g., a switching element such as a transistor or diode, coupled to a storage element, e.g., a resistive storage element including a phase change material or a metal oxide material between a pair of electrodes. Formation of resistive memory cells can involve the use of etch chemistries to etch materials corresponding to the select devices and/or storage elements. Some etch chemistries can be useful for etching memory cell materials, but may result in contamination of other memory cell materials during cell formation.

DETAILED DESCRIPTION

Figure 1:
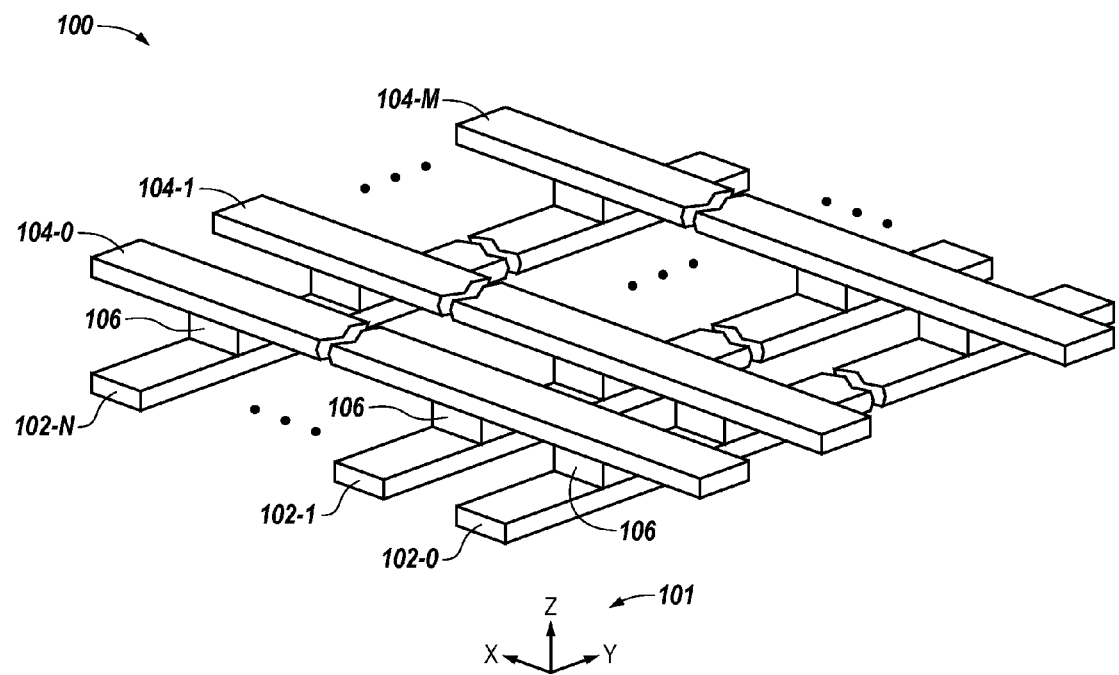
FIG. 1 is a block diagram of a portion of an array of memory cells in accordance with one or more embodiments of the present disclosure.

Memory cells, arrays of memory cells, and methods of forming the same with sealing material on sidewalls thereof are disclosed herein. One example of forming a memory cell includes forming a stack of materials, forming a trench to a first depth in the stack of materials such that a portion of at least one of the active storage element material and the active select device material is exposed on sidewalls of the trench. A sealing material is formed on the exposed portion of the at least one of the active storage element material and the active select device material and the trench is deepened such that a portion of the other of the at least one of the active storage element material and the active select device material is exposed on the sidewalls of the trench.

Embodiments of the present disclosure can provide benefits such as at least partial protection from contamination of active memory cell materials during formation processes, for instance. Active memory cell materials can include active materials associated with a storage element, e.g., resistive storage materials including resistance variable materials such as phase change materials (PCMs), metal oxide materials, etc., as well as active materials associated with a select device, e.g., a chalcogenide alloy associated with an ovonic threshold switch (OTS), for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense. Moreover, as used herein," an element and/or feature can refer to one or more of such elements and/or features. As utilized herein, forming a first element and/or feature "on" a second element and/or feature can denote forming the first element and/or feature on a particular surface of the second element and/or feature.

FIG. 1 is a block diagram of a portion of an array 100 of memory cells in accordance with one or more embodiments of the present disclosure. In this example the array 100 is a cross-point array 100 including memory cells 106 at the intersections of a first plurality of conductive lines 102-0, 102-1, . . . , 102-N, e.g., access lines, which may be referred to herein as word lines, and a second plurality of conductive lines 104-0, 104-1, . . . , 104-M, e.g., data lines, which may be referred to herein as bit lines. Coordinate axes 101 indicates that the conductive lines 104-0, 104-1, . . . , 104-M are oriented in an x-direction and the conductive lines 102-0, 102-1, . . . , 102-N are oriented in a y-direction, in this example. As illustrated, the first conductive lines 102-0, 102-1, . . . , 102-N are substantially parallel to each other and are substantially orthogonal to the second conductive lines 104-0, 104-1, . . . , 104-M, which are substantially parallel to each other; however, embodiments are not so limited. As used herein, the term "substantially" intends that the modified characteristic need not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

The memory cells 106 of cross-point array 100 can be memory cells such as those formed in accordance with the example illustrated below with respect to FIGS. 2A-2N. As an example, the memory cells 106 can be phase change random access memory (PCRAM) cells, resistive random access memory (RRAM) cells, conductive random access memory (CBRAM) cells, and/or spin transfer torque random access memory (STT-RAM) cells, among other types of memory cells. In various embodiments, the memory cells 106 can have a "stack" structure that includes a select device, e.g., an access device, coupled in series to a storage element such as those described herein. For instance, the access device can be a diode, field effect transistor (FET), a bipolar junction transistor (BJT), an ovonic memory switch (OMS), or an ovonic threshold switch (OTS), among others.

In a number of embodiments, the select device and storage element associated with the respective memory cells 106 can be series coupled two-terminal devices. For instance, the select device can be a two-terminal OTS, e.g., a chalcogenide alloy formed between a pair of electrodes, and the storage element can be a two-terminal phase change storage element, e.g., a phase change material (PCM) formed between a pair of electrodes. A memory cell 106 including an OTS in series with a PCM can be referred to as a phase change material and switch (PCMS) memory cell. In a number of embodiments, an electrode can be shared between the select device and storage element of the memory cells 106. Also, in a number of embodiments, the conductive lines 104-0, 104-1, . . . , 104-M and the conductive lines 102-0, 102-1, . . . , 102-N can serve as top or bottom electrodes corresponding to the memory cells 106.

As used herein, a storage element refers to a programmable portion of a memory cell 106, e.g., the portion programmable to different data states. For example, in PCRAM and RRAM cells, a storage element can include the portion of the memory cell having a resistance that is programmable to data states responsive to applied programming signals, e.g., voltage and/or current pulses, for instance. A storage element can include, for instance, one or more resistance variable materials such as a phase change material. As an example, the phase change material can be a chalcogenide alloy such as an indium(In)-antimony(Sb)-tellurium(Te) (IST) material, e.g., $In_2Sb_2Te_5$, $In_1Sb_2Te_4$, $In_1Sb_4Te_7$, etc., or a germanium(Ge)-antimony(Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other phase change materials. The hyphenated chemical composition notation, as used herein, indicates the elements included in a mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals, e.g., transition metals, alkaline earth metals, and/or rare earth metals. Embodiments are not limited to a particular resistive variable material or materials associated with the storage elements of the memory cells 106. For instance, other examples of resistive variable materials that can be used to form storage elements include binary metal oxide materials, colossal magnetoresistive materials, and/or various polymer based resistance variable materials, among others.

Although not illustrated, in a number of embodiments, the array 100 can be part of a three dimensional (3D) architecture, with a plurality of arrays 100 vertically stacked on each other. In such embodiments, conductive lines such as 104-0, 104-1, . . . , 104-M can serve as a bit line for one level of the 3D array and as a word line for a subsequent level of the 3D array, for instance.

In operation, the memory cells 106 of array 100 can be programmed by applying a voltage, e.g., a write voltage, across the memory cells 106 via selected conductive lines, e.g., word lines 102-0, 102-1, . . . , 102-N and bit lines 104-0, 104-1, . . . , 104-M. The width and/or magnitude of the voltage pulses across the memory cells 106 can be adjusted, e.g., varied, in order to program the memory cells 106 to logic states, e.g., by adjusting a resistance level of the storage element.

A sensing, e.g., read, operation can be used to determine the logic state of a memory cell 106. For instance, voltages can be applied to a bit line 104-0, 104-1, . . . , 104-M and word line 102-0, 102-1, . . . , 102-N corresponding to a selected memory cell 106, and current through the cell responsive to a resulting voltage difference can be sensed. Sensing operations can also include biasing unselected access lines, e.g., word lines, and data/sense lines, e.g., bit lines (for example, word lines and bit lines coupled to non-selected cells) at voltages in order to sense the logic state of a selected cell 106.

An issue that may affect forming and/or subsequent operation of cross-point memory cell arrays is cross-contamination, e.g., poisoning, of active materials of different memory cell portions, such as an active material of a select device and an active material of a storage element, during certain portions of the device fabrication process, for instance during an etching and/or cleaning processes. For instance, forming a memory cell can include forming material stacks and etching through one or more stacks, for instance to define cell structures such as word lines, bit lines, and/or individual cell stacks. As an example, a chemical composition, e.g., etch chemistry, can be used to form trenches in a stack of materials, e.g., to define word lines. In situations in which different active materials, e.g., an active storage element material and an active select device material, are present in the material stack, the subsequent etching of one of the active materials, e.g., an active material lower in the stack, can result in contamination of one or more other active material(s) in the stack, e.g., those previously etched and having exposed sidewalls, during formation of the trench.

A number of embodiments of the present disclosure can provide at least partial protection from such cross-contamination via a formation process that includes forming a partial trench in a material stack such that sidewalls of a first active material are exposed, and sealing the sidewalls of the first active material prior deepening the trench, which includes exposing sidewalls of a second/different active material associated with the memory cell. Reducing and/or preventing contamination/poisoning of active cell materials can improve the operational characteristics of memory cells as compared to those formed in accordance with previous approaches, for instance.

Figure 2A:
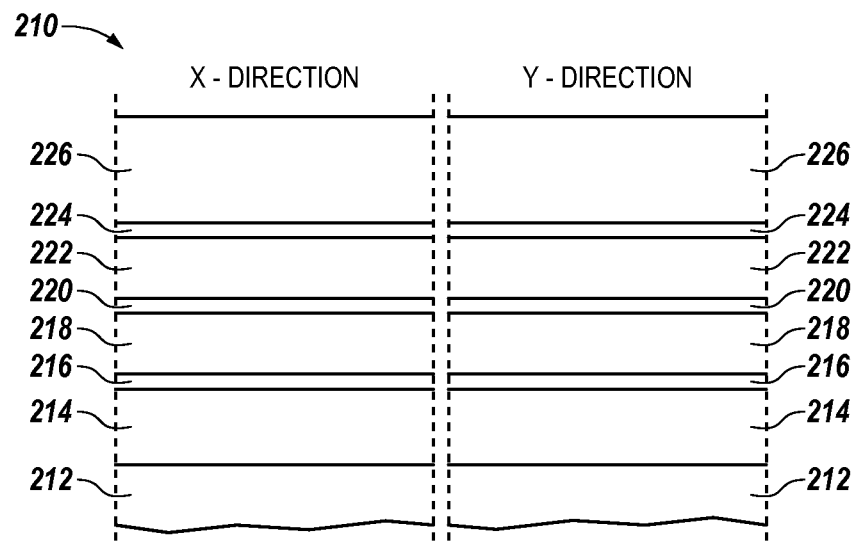
FIGS. 2A-2N illustrate cross-sectional views of an example of processing steps associated with forming a portion of an array of memory cells in accordance with one or more embodiments of the present disclosure.
Figure 2B:
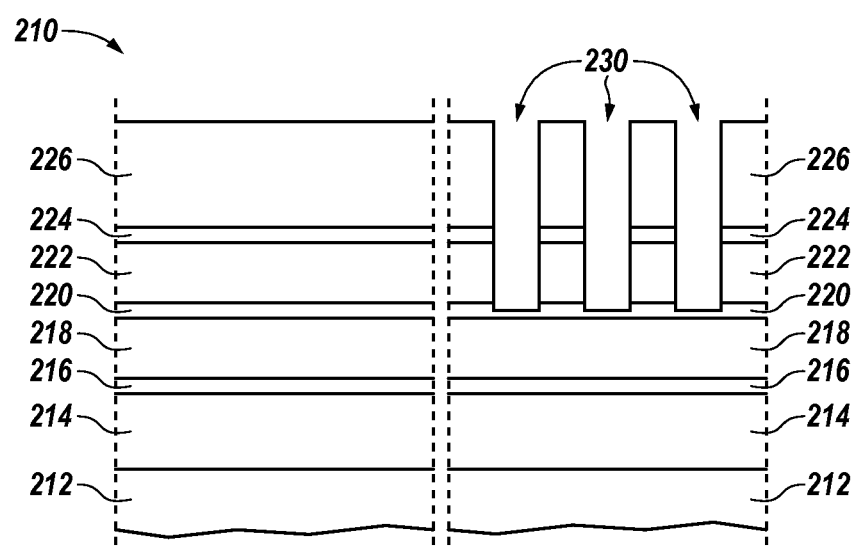
Figure 2C:
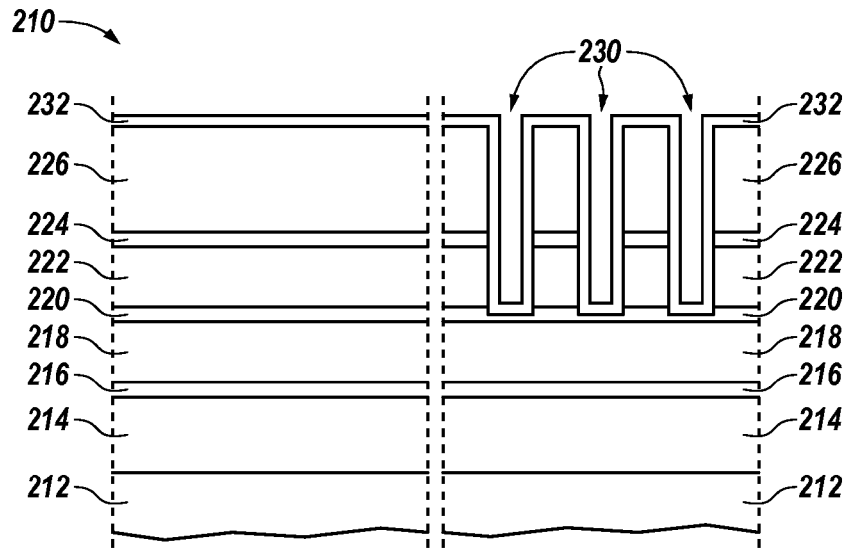
Figure 2D:
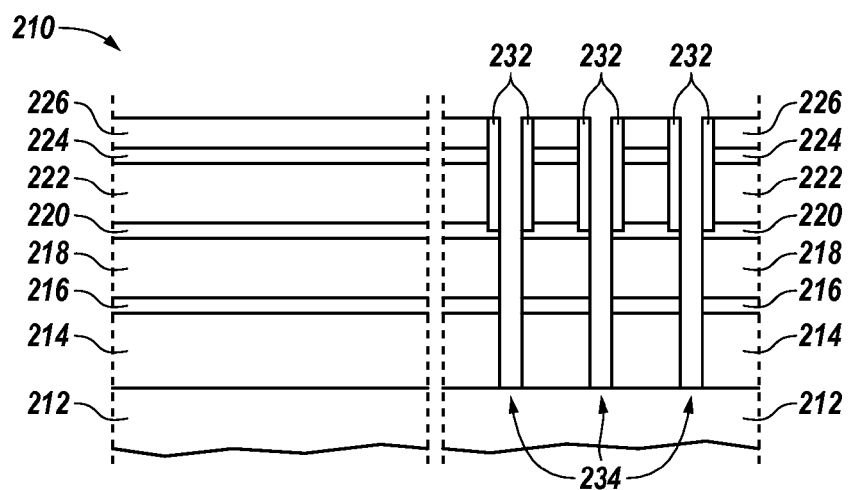
Figure 2E:
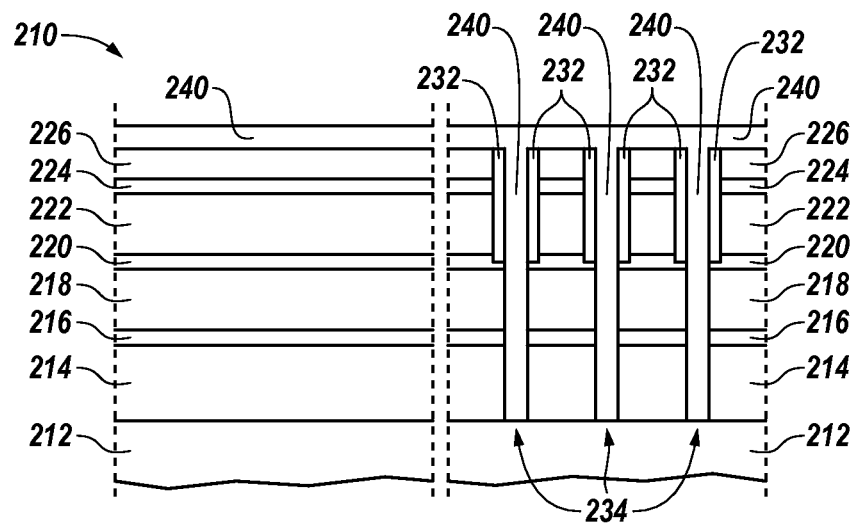
Figure 2F:
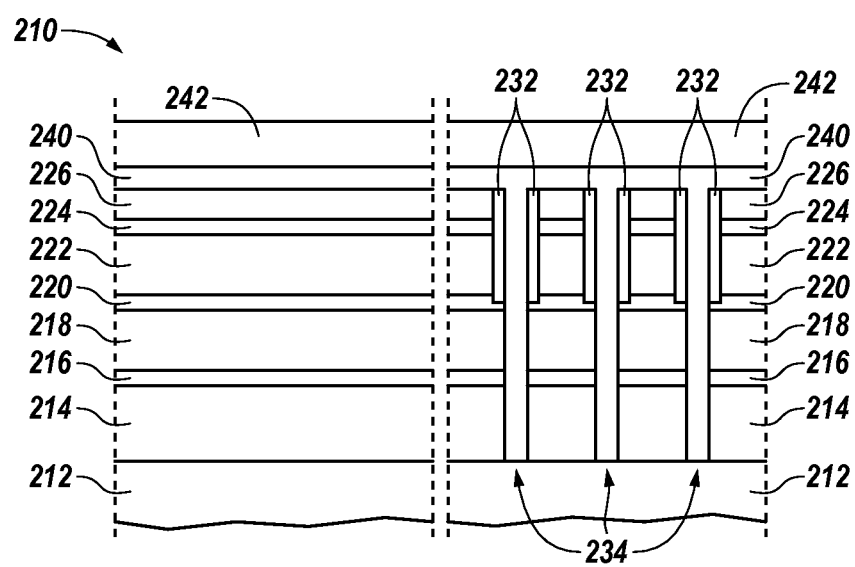
Figure 2G:
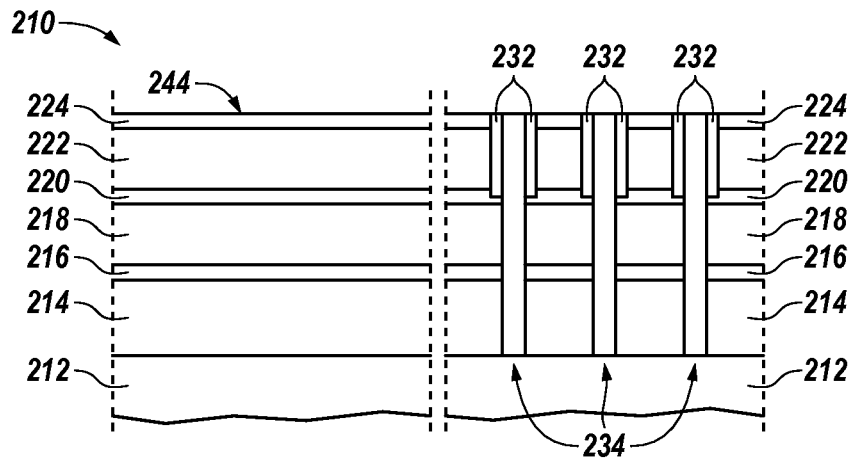
Figure 2H:
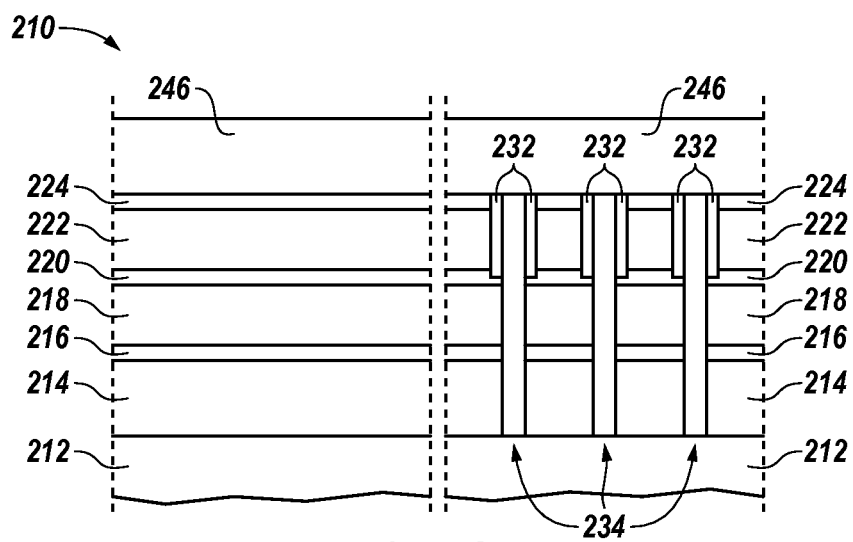
Figure 2I:
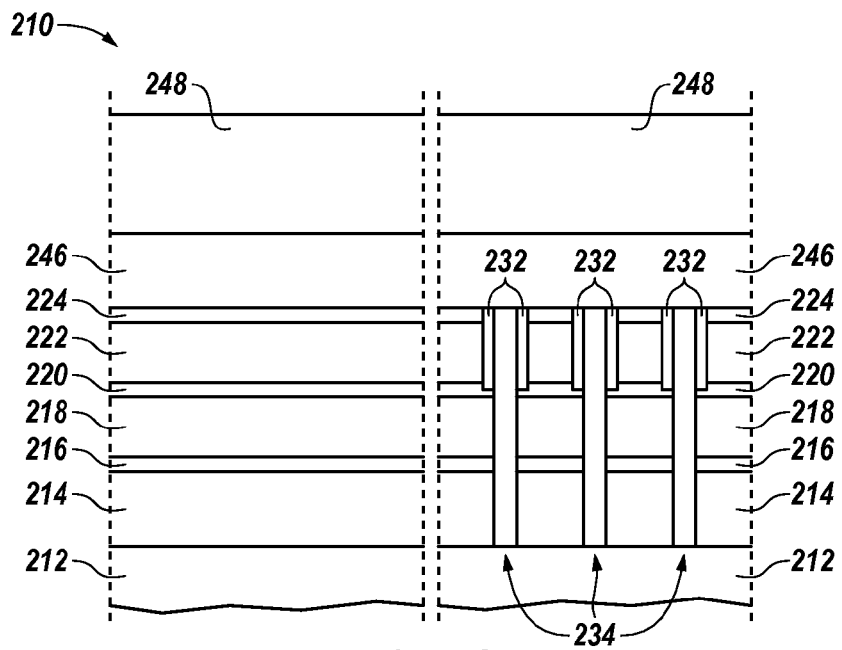
Figure 2J:
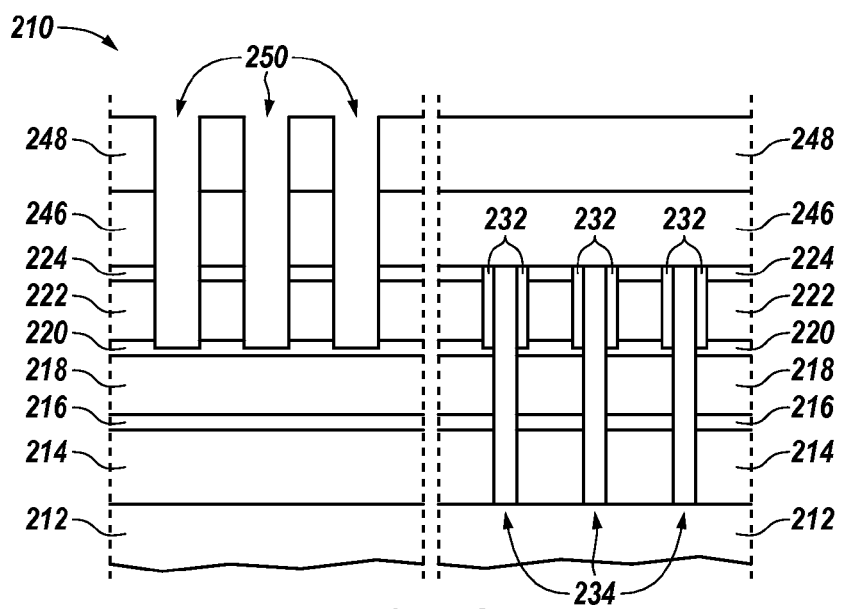
Figure 2K:
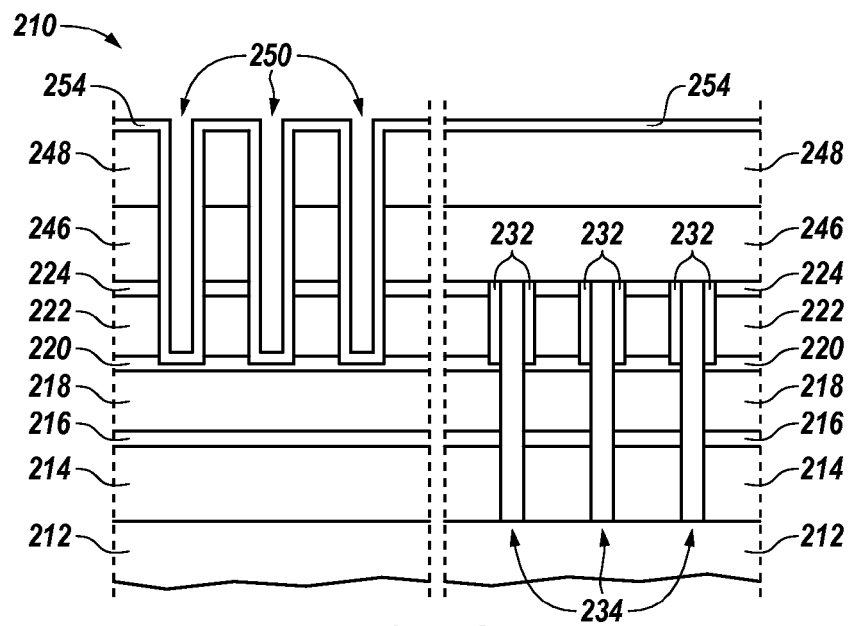
Figure 2L:
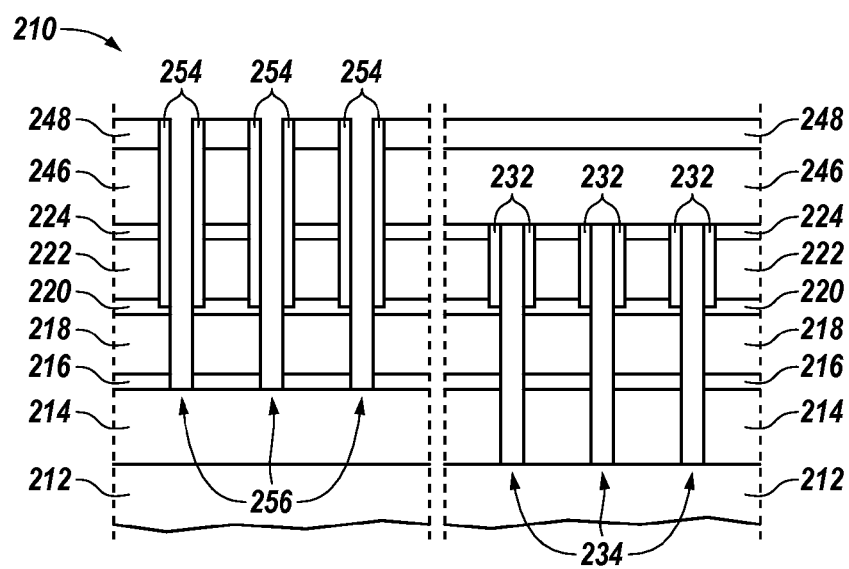
Figure 2M:
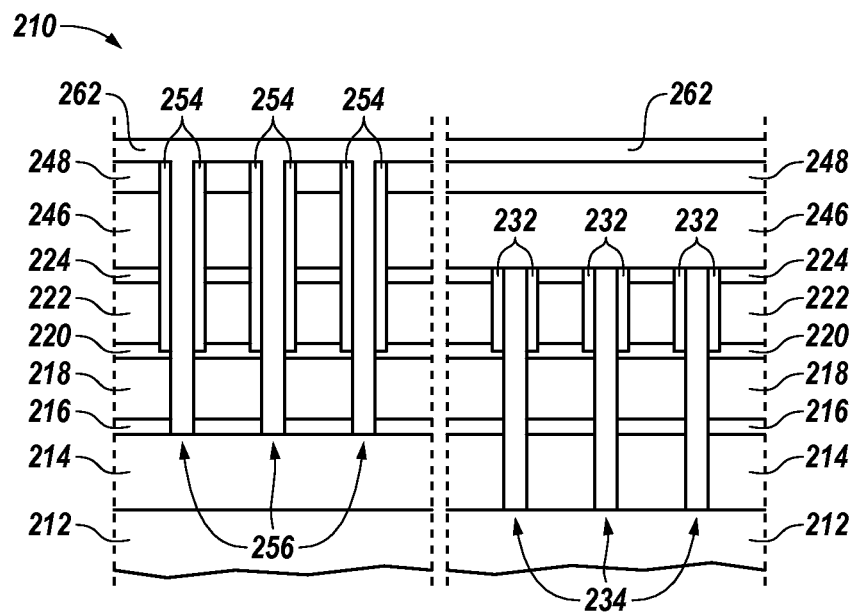
Figure 2N:
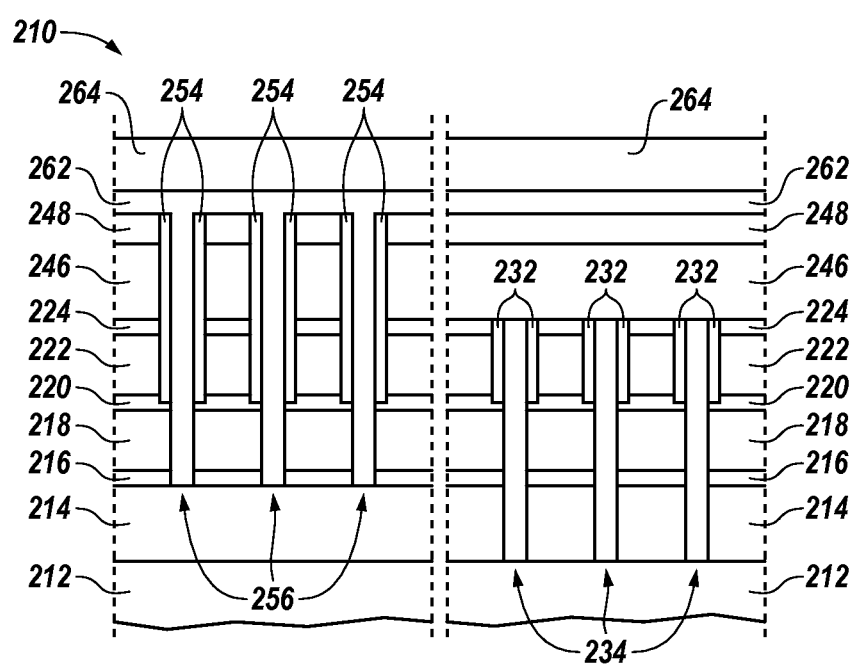

FIGS. 2A-2N illustrate cross-sectional views of an example of processing steps associated with forming a portion of an array of memory cells in accordance with one or more embodiments of the present disclosure. As indicated, the left side of FIGS. 2A-2N represents a cross-sectional view along an x-direction, e.g., a bit line direction, and the right side of FIGS. 2A-2N represents a cross-sectional view along a y-direction, e.g., a word line direction, in this example. Embodiments are not so limited. For instance, the x-direction can be a word line direction and the y-direction can be a bit line direction. The cross-sectional views FIGS. 2A-2N are taken at a location corresponding to a memory cell stack, e.g., at an intersection of a word line and bit line of an array.

FIG. 2A illustrates an array structure 210 comprising a materials stack formed on a substrate 212. As used in the present disclosure, the term "substrate" can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS), e.g., a CMOS front end with a metal backend, and/or other semiconductor structures and technologies. Various circuitry, such as decode circuitry, for instance, associated with operating a memory array can be formed in substrate 212. Furthermore, when reference is made to a "substrate" in the following description, previous process steps may have been utilized to form regions or junctions in the base semiconductor structure or foundation.

In FIG. 2A, the stack of materials includes a conductive material 214 formed on the substrate 212, for instance, on a surface of the substrate 212. The conductive material can comprise, for instance, conductive and/or semi-conductive metals and metal alloys such as tungsten, titanium, platinum, nickel, strontium, hafnium, zirconium, tantalum, aluminum, oxides and nitrides thereof, and combinations thereof. However, embodiments of the present disclosure are not limited to particular conductive and/or semi-conductive metals and metal alloys. In a number of embodiments, the conductive material 214 can serve as conductive lines, e.g., word lines and/or bit lines, of the array. Although not illustrated in FIG. 2A, a dielectric material can be formed between the conductive material 214 and substrate 212, in a number of embodiments.

The array structure 210 shown in FIG. 2A includes an electrode material 216 formed on the conductive material 214, an active material 218 formed on electrode material 216, an electrode material 220 formed on the active material 218, an active material 222 formed on the electrode material 220, and an electrode material 224 formed on the active material 222. The electrode materials 216, 220, and 224 can comprise various conductive and/or semiconductive materials and/or combinations thereof. In a number of embodiments, the electrode materials 216, 220, and/or 224 can comprise a carbon material having various structural configurations, such as amorphous carbon, graphite, diamond, and fullerenes, e.g., buckyballs, carbon nanotubes, carbon nanobuds, and carbon nanofibers, among others. Embodiments are not limited to a particular material compositions for electrode materials 216, 220, and 224 composition.

In a number of embodiments, the active material 218 can be an active select device material 218, e.g., an active material of a switching element corresponding to a memory cell. As an example, the active material 218 can be a chalcogenide alloy of an OTS, which can serve as the select device structure of the memory cell. For instance, the OTS can comprise an active OTS material 218 formed between the electrode materials 216 and 220. However, embodiments are not so limited. For instance, the active select device material 218 can be a material associated with a transistor, a diode, an OMS, and/or other select device structures. An active material corresponding to an OTS can be a chalcogenide alloy comprising tellurium, sulfur, arsenic, germanium, and/or selenium, for instance, among various other amorphous semiconductive materials exhibiting reversible transition between a resistive state and a conductive state responsive to applied electric fields. An active OTS material can, for instance, revert to a resistive state after an electrical field falls below a value.

In a number of embodiments, the active material 222 can be an active storage element material 222, e.g., a programmable portion of a memory cell. As an example, the active material 222 can be a resistance variable material such as a phase change material or metal oxide material, for instance, among various other resistance variable materials, such as those described above. However, embodiments are not so limited.

Although the example above describes active material 218 as an active select device material and active material 222 as an active storage element material, embodiments are not so limited. For instance, in a number of embodiments, the active material 218 can be an active storage element material and the active material 222 can be an active select device material. The active materials 218 and 222 are formed between electrode materials 216 and 224, with electrode material 220 formed between the active materials 218 and 222. As such, in a number of embodiments, the electrode 220 can serve as a shared electrode between active materials 218 and 222. As an example, a select device of the memory cell can comprise a bottom electrode material 216, an active select device material 218, and a top electrode material 220, while the storage element of the memory cell can comprise a bottom electrode material 220, an active storage element material 222, and a top electrode material 224. In this example, shared electrode 220 can serve to integrate the select device with the storage element of the memory cell, e.g., a two-terminal select device such as an OTS formed in series and integrated with a two-terminal storage element such as a PCM. It is understood that in the example provided above, the positions of the active select device material and the active storage element material can be reversed, e.g., such that electrode material 216 serves as a bottom electrode material for the storage element of the memory cell and the electrode material 224 serves as the top electrode material for the select device of the memory cell.

The example illustrated in FIG. 2A includes a hard mask material 226 formed on the electrode material 224. The hard mask material 226 can comprise a mask material such as a silicon nitride material, e.g., $Si_3N_4$, among various other mask materials, and can be formed via known semiconductor processing techniques and processes that may be suitable for etching techniques.

The materials illustrated in FIG. 2A and in subsequent FIGS. 2B-2N can be formed via various semiconductor processes including, but not limited to, physical vapor deposition (PVD), chemical vapor deposition (CVD), and/or atomic layer deposition (ALD) processes. Such processing may incorporate various masking and etching techniques as well as planarization processes, e.g., chemical mechanical planarization (CMP).

The stack of materials 214, 216, 218, 220, 222, 224, and 226 of array structure 100 shown in FIG. 2A, and formed on substrate 212, can be collectively referred to as a word line stack, in a number of embodiments, e.g., in embodiments in which the conductive material 214 serves as word lines of the memory array. Similarly, the stack of materials shown in FIG. 2A can be referred to as a bit line stack, e.g., in embodiments in which the conductive material 214 serves as bit lines for the array. As will be described further below, processing of the material stack shown in FIG. 2A can be performed to define individual conductive lines associated with conductive material 214.

FIG. 2B illustrates trenches 230 formed in the word line stack shown in FIG. 2A. Although three trenches 230 are illustrated, embodiments are not limited to a particular number of trenches. In this example, the trenches 230 are formed in the x-direction to a first depth in the word line stack and can be referred to as "partial trenches" or "initial trenches" as the trenches 230 are not formed through the entire word line stack comprising materials 214, 216, 218, 220, 222, 224, and 226.

The trenches 230 can be formed via a masking and etching process. In this example, forming the trenches 230 includes etching through the hard mask material 226, the electrode material 224, the active material 222, and a portion of the electrode material 220, e.g., the etch ends/stops on the electrode material 220.

In various previous approaches, the entire word line stack comprising materials 214, 216, 218, 220, 222, 224, and 226 may have been etched in a single etch process. However, etching in such a manner can lead to adverse effects such as contamination/poisoning issues due to the exposed sidewalls of active materials as subsequent materials are etched. For instance, etching through active material 218 while sidewalls of active material 222 are exposed can lead to re-sputtering of the active material 218, which can lead to contamination/poisoning of the active material 222, which can adversely affect the properties of the active material 222. Similarly, etching through conductive material 214 while sidewalls of active materials 218 and/or 222 are exposed can lead to contamination of the active materials 218 and/or 222, e.g., via re-sputtering of the conductive material 214.

FIG. 2C illustrates the array structure 210 of FIG. 2B subsequent to formation of a sealing material 232 thereon. As an example, the sealing material 232 can be formed via an ALD process and can comprise, for instance, dielectric materials selected from a group that includes aluminum oxide ($Al_xO_y$), silicon nitride ($Si_3N_4$), silicon dioxide ($SiO_2$), titanium dioxide ($TiO_2$), lanthanum oxide ($La_2O_3$), lanthanum aluminate ($LaAlO_3$), gallium oxide ($Ga_2O_3$), zirconium oxide ($ZrO_2$), zirconium silicon oxide ($Zr_xSi_yO_z$), zirconium titanium oxide ($Zr_xTi_yO_z$), hafnium oxide ($HfO_2$), hafnium titanium oxide ($Hf_xTi_yO_z$), strontium titanate ($SrTiO_3$), lanthanum calcium manganese oxide (LCMO), magnesium oxide (MgO), tin dioxide ($SnO_2$), zinc peroxide ($ZnO_2$), titanium silicon oxide ($Ti_xSi_yO_z$), and/or a hafnium silicon oxide ($Hf_xSi_yO_z$), among other suitable dielectric materials. However, embodiments are not limited to particular dielectric materials. Embodiments are not limited to a particular formation process for material 232. For instance, in a number of embodiments, the sealing material can be formed via a conformal CVD process.

As illustrated in FIG. 2C, the sealing material 232 is formed on a surface of a residual mask material 226 left after etching of the trenches 230 and in the trenches 230, e.g., on sidewalls and the bottom. The sealing material 232 is formed to a thickness sufficient to prevent contamination of materials within the trench during subsequent processing, e.g., of active cell materials during deepening of the trenches 230. In this example, the sealing material 232 is formed on exposed portions of the active material 222 within the trenches 230 and can prevent contamination thereof during further processing steps as described further herein. In a number of embodiments, the sealing material 232 is formed to a thickness of not greater than about 5 nanometers (nm), e.g., 1-3 nm. Embodiments are not limited to a particular thickness of material 232, which may depend on the feature sizes of the memory cells, for example. As such, the thickness of the sealing material 232 can be less than 1 nm or greater than 5 nm, in a number of embodiments.

FIG. 2D illustrates the array structure 210 of FIG. 2C subsequent to deepening of the partial trenches 230. Deepening of the trenches 230 can be performed via an etch process, e.g., a dry etch, through remaining materials in the word line stack, e.g., a remaining portion of electrode material 220, active material 218, electrode material 216, and conductive material 214, such that the etch stops on the substrate 212. As such, deepening of trenches 230 results in completed trenches 234 and definition of conductive lines 214 of the array. As illustrated, the etch process of FIG. 2D further reduces the thickness of the residual hard mask material 226 and removes the sealing material 232 previously formed on the upper surface of the residual hard mask 226. As shown in FIG. 2D, the etch process to form the completed trenches 234 leaves the portions of the active material 218 within the trenches 234 exposed during etching of the electrode material 216 and the conductive material 214.

Although not illustrated, in a number of embodiments, the process describe in 2C can optionally be performed in the trenches 234 subsequent to etching through active material 218 and prior to etching through conductive material 214 to deposit a sealing material on the active material 218. In such embodiments, the sealing material would be formed on exposed sidewall portions of the active material 218, which can protect the active material 218 from contamination during the subsequent etching through the conductive material 214.

In an example method, a memory cell can be formed by forming a stack of materials 210 that includes an active storage element material 222, an active select device material 218, and a conductive material 214 associated with a conductive line corresponding to the memory cell. Forming the memory cell can include forming a trench 230 to a first depth in the stack of materials 210 such that a portion of at least one of the active storage element material 222 and the active select device material 218 is exposed on sidewalls of the trench 230. A sealing material 232 can be formed on the exposed portion of the at least one of the active storage element material 222 and the active select device material 218 and the trench can be deepened such that a portion of the other of the at least one of the active storage element material 222 and the active select device material 218 is exposed on the sidewalls of the trench 234. For example, prior to deepening the trench 230, the sealing material 232 can be formed on the sidewalls of the trench 230 such that the portion of the at least one of the active storage element material 222 and the active select device material 218 is not exposed on the sidewalls of the trench 230 during deepening of the trench 230. In one or more embodiments, positioning of the active storage element material and the active select device material can be reversed in the series such that active storage element material corresponds to number 218 and the active select device material corresponds to number 222.

Forming the sealing material 232 can, in one or more embodiments, include passivating the sidewalls during deepening of the trench 234. As such, the portion of the at least one of the active storage element material 222 and the active select device material 218 can be passivated with the sealing material 232 formed thereon during deepening of the trench 234. That is, the portion of the at least one of the active storage element material 222 and the active select device material 218 can be at least partially protected from contamination with other material during deepening of the trench. Forming the sealing material 232 can, in one or more embodiments, include depositing the sealing material 232 with ALD to a thickness of not greater than about 5 nm.

In one or more embodiments, forming the memory cell also can include passivating the sidewalls with the sealing material 232 formed thereon from contamination during cleaning of the sidewalls before, during, and after deepening of the trench 230 and 234. For example, passivating the sidewalls with the sealing material 232 formed thereon can include passivating the portion of the at least one of the active storage element material 222 and the active select device material 218 with the sealing material 232 formed thereon during cleaning of the sidewalls before, during, and after deepening of the trench 230 and 234.

In one or more embodiments, forming the memory cell can include forming the trench in a series of materials, where at least one of the series of materials is formed with a chemical composition that differs from a chemical composition of at least two other materials with which it is in contact in the series. For example, each of the chemical compositions can differ for an active storage element material 222, an electrode material 216, and an active select device material 218 formed in series. In some embodiments, a conductive material 214 with a different chemical composition can be included in the series.

In one or more embodiments, forming the trench 230 in the stack of materials, e.g., at 214 through 226, can include etching the trench 230 to the first depth in the stack of materials. Subsequent to forming the trench 230 to the first depth, deepening the trench 234 can include etching the trench 234 through the other of the at least one of the active storage element material 222 and the active select device material 218 and the conductive material 214.

According to another example method in accordance with one or more embodiments of the present disclosure, a plurality of memory cells can be formed by forming a first stack of materials, e.g., at 214 through 226, on a first conductive material 214 and forming first trenches 234 in the first stack by etching through the first stack in a first direction, e.g., in the x-direction. Forming the first trenches 234 can, in one or more embodiments, include performing an initial etch through a first portion of the first stack to form initial trenches 230 in the first direction, forming a sealing material 232 on sidewalls of the initial trenches 230, and performing a second (e.g., a completion) etch through a remaining portion of the first stack and the first conductive material 214. In one or more embodiments, performing the second (e.g., the completion) etch through the first conductive material 214 can include forming first conductive lines corresponding to the memory cells. Performing the initial etch through the first portion of the first stack can, in on or more embodiments, include ending the initial etch on the second electrode material 220.

In one or more embodiments, forming the first stack, e.g., at 214 through 226, can include forming an active select device material 218 between a first electrode material 216 and a second electrode material 220 and forming an active resistive storage element material 222 between the second electrode material 220 and a third electrode material 224. The active select device material 218, the first electrode material 216, and the second electrode material 220 can, in one or more embodiments, correspond to an OTS, and the active resistive storage element material 222, the second electrode material 220 and the third electrode material 224 can, in one or more embodiments, correspond to a phase change storage element. The first electrode material 216 can, in one or more embodiments, be formed in contact with the first conductive material 214. Alternatively, the third electrode material 224 can, in one or more embodiments, be formed in contact with the first conductive material 214.

Forming the sealing material 232 on the sidewalls of the initial trenches 230 can include sealing at least a portion of the active resistive storage element material 222. Alternatively, forming the sealing material 232 on the sidewalls of the initial trenches 230 can include sealing at least a portion of the active select device material 218. As previously indicated, in one or more embodiments, positioning of the active storage element material and the active select device material can be reversed in the series such that active storage element material corresponds to indicator number 218 and the active select device material corresponds to number 222.

In one or more embodiments, forming the first trenches 234 can include performing an etch through a second portion of the first stack such that a depth of the first initial trenches 230 is increased subsequent to forming the sealing material 232 on the sidewalls of the initial trenches 230 and prior to performing the second (e.g., the completion) etch. A sealing material, in one or more embodiments, can subsequently be formed on the sidewalls of the initial trenches to the increased depth. Accordingly, forming the sealing material on the sidewalls of the initial trenches 230 to the increased depth can include sealing at least a portion of the at least one of the active resistive storage element material 222 and the active select device material 218.

According to another example method in accordance with one or more embodiments of the present disclosure, a plurality of memory cells can be formed by forming a first stack of materials, e.g., at 214 through 226, on a substrate 212. In one or more embodiments, the first stack can include a first electrode material 216, an active resistive storage element material 222 in series with an active select device material 218, where a second electrode material 220 is formed between the active resistive storage element material 222 and the active select device material 218, and a third electrode material 224 on an opposite side of the stack from the first electrode 216. A first initial trench 230 can be formed in a first direction through the third electrode material 224 and ending on the second electrode material 220 and a first sealing material 232 can be formed on sidewalls of the first initial trench 230.

In one or more embodiments, a first completed trench 234 can be formed in the first direction by etching through: the first sealing material 232 on a bottom of the first initial trench 230; the second electrode material 220; the first electrode material 216; at least one of the active resistive storage element material 222 and the active select device material 218; and a first conductive material 214 associated with a remaining portion of the first stack.

FIG. 2E illustrates the array structure 210 of FIG. 2D subsequent to formation of a dielectric material 240 thereon. The dielectric material 240 can be a dielectric nitride and/or oxide material, for instance, and can be formed so as to fill the completed trenches 234. As such, in this example, the dielectric material is formed on portions of the sealing material 232, the active material 218, the electrode material 216, and the conductive material 214 within the trenches 234. The dielectric material 240 formed in the trenches 234 can serve to isolate memory cells from each other, for instance.

FIG. 2F illustrates the array structure 210 of FIG. 2E subsequent to formation of a dielectric material 242 thereon. The dielectric material 242 can be an oxide material such as silicon dioxide (SiO₂), for instance; however, embodiments are not so limited. As an example, the oxide material 242 can serve to fill areas, e.g., cavities, within and/or outside the area in which the plurality of memory cells are located.

FIG. 2G illustrates the array structure 210 of FIG. 2F subsequent to a planarization process. The surface of the structure can be planarized via a CMP process, for instance, down to the electrode material 224, such that those materials formed above the electrode material 224 are removed, e.g., dielectric material 242 not filling areas, portions of dielectric material 240, residual hard mask 226, and portions of the sealing material 232.

FIG. 2H illustrates the array structure 210 of FIG. 2G subsequent to formation of a conductive material 246 on the planarized surface thereof. In a number of embodiments, the conductive material 246 can serve as conductive lines, e.g., bit lines, of the array. The conductive material can comprise tungsten, titanium, platinum, nickel, strontium, hathium, zirconium, tantalum, aluminum, oxides and nitrides thereof, and/or combinations thereof, among various other suitable conductive and/or semi-conductive metals and metal alloys.

FIG. 2I illustrates the array structure 210 of FIG. 2H subsequent to formation of a hard mask material 248 thereon. The conductive material 246 and hard mask material 248 can be collectively referred to as a second stack of materials, which are formed on residual portions of the word line stack, e.g., the word line stack illustrated in FIG. 2A. As an example, the hard mask material 248 can comprise $Si_3N_4$, among various other suitable hard mask materials.

FIG. 2J illustrates the array structure 210 of FIG. 2I subsequent to formation of trenches 250 therein. In this example, the trenches 250 are formed in the y-direction to a second depth. The trenches 250 can be formed via a masking and etching process. Similar to the trenches 230 illustrated in FIG. 2B, the trenches 250 can be referred to as "partial trenches" or "initial trenches" as the trenches 250 are not completed trenches, which will be formed through each of materials 248, 246, 224, 222, 220, 218, and 216. Rather, in this example, the partial trenches 250 are formed through hard mask material 248, conductive material 246, electrode material 224, active material 222, and a portion of electrode material 220, e.g., the etch ends/stops on the electrode material 220. As shown in FIG. 2J, the etch process used to form trenches 250 reduces the thickness of the hard mask material 248 and defines conductive lines, e.g., bit lines 246, of the array.

FIG. 2K illustrates the array structure 210 of FIG. 2J subsequent to formation of a sealing material 254 thereon. As an example, the sealing material 254 can be formed via an ALD process and can comprise, for instance, dielectric materials selected from a group that includes aluminum oxide ($Al_xO_y$), silicon nitride ($Si_3N_4$), silicon dioxide ($SiO_2$), titanium dioxide ($TiO_2$), lanthanum oxide ($La_2O_3$), lanthanum aluminate ($LaAlO_3$), gallium oxide ($Ga_2O_3$), zirconium oxide ($ZrO_2$), zirconium silicon oxide ($Zr_xSi_yO_z$), zirconium titanium oxide ($Zr_xTi_yO_z$), hafnium oxide ($HfO_2$), hafnium titanium oxide ($Hf_xTi_yO_z$), strontium titanate ($SrTiO_3$), lanthanum calcium manganese oxide (LCMO), magnesium oxide (MgO), tin dioxide ($SnO_2$), zinc peroxide ($ZnO_2$), titanium silicon oxide ($Ti_xSi_yO_z$), and/or a hafnium silicon oxide ($Hf_xSi_yO_z$), among other suitable dielectric materials. However, embodiments are not limited to particular dielectric materials. Embodiments are not limited to a particular formation process for material 254. For instance, in a number of embodiments, the sealing material 254 can be formed via a conformal CVD process.

As illustrated in FIG. 2K, the sealing material 254 is formed on the residual hard mask material 248 and in the trenches 250, e.g., on sidewalls and the bottom. The sealing material 254 is formed to a thickness sufficient to prevent contamination of materials within the trench during subsequent processing, e.g., of active cell materials during deepening of the trenches 250. In this example, the sealing material 254 is formed on exposed portions of the active material 222 within the trenches 250 and can prevent contamination thereof during further processing steps as described further herein. In a number of embodiments, the sealing material 254 is formed to a thickness of not greater than about 5 nm, e.g., 1-3 nm. Embodiments are not limited to a particular thickness of material 254, which may depend on the feature sizes of the memory cells, for example. As such, the thickness of the sealing material 254 can be less than 1 nm or greater than 5 nm, in a number of embodiments.

FIG. 2L illustrates the array structure 210 of FIG. 2K subsequent to deepening of the partial trenches 250. Deepening of the initial trenches 250 can be performed via an etch process, e.g., a dry etch, through remaining materials in the material stack, e.g., a remaining portion of electrode material 220, active material 218, and electrode material 216, such that the etch stops on the conductive material 214, which can comprise conductive lines, e.g., word lines, of the array. As such, deepening of trenches 250 results in completed trenches 256 and definition of memory cells of the array, e.g., memory cells such as cells 106 shown in FIG. 1. As illustrated, the etch process of FIG. 2L further reduces the thickness of the residual hard mask material 248 and removes sealing material 254 previously formed on the upper surface of the hard mask 248.

In accordance with one or more embodiments of an example method, a plurality of memory cells can be formed by forming a second stack of materials, e.g., at 246 and 248, on the first stack, e.g., at 214 through 226. Second trenches 256 can, in one or more embodiments, be formed by etching through the second stack, e.g., at 246 and 248, and at least a first portion of the first stack, e.g., at 222 and 224, in a second direction, e.g., in the y-direction. Forming the second trenches 256 can, in one or more embodiments, include performing an initial etch through the second stack and the at least a first portion of the first stack to form initial trenches 250 in the second direction, forming a sealing material 254 on sidewalls of the initial trenches 250 in the second direction, and performing an additional etch through at least a second portion of the first stack, e.g., at 216, 218, and 220.

In one or more embodiments, forming the first stack of materials, e.g., at 214 through 226, can include forming the active select device material 218 between the first electrode material 216 and the second electrode material 220, forming the active resistive storage element material 222 between the second electrode material 220 and the third electrode material 224, and forming the second conductive material 246 on the third electrode material 224. In one or more embodiments, the second stack of materials, e.g., at 246 and 248, includes the second conductive material 246 and performing the initial etch through the second stack and the at least the first portion of the first stack includes etching through the second conductive material 246 to form second conductive lines.

In one or more embodiments, performing the additional etch through the at least the second portion of the first stack can include ending the additional etch on the first conductive material 214 corresponding to the first conductive lines. Performing the initial etch through the second stack, e.g., at 246 and 248, and the at least the first portion of the first stack, e.g., at 216 and 218, can include ending the initial etch on the second electrode material 220. Accordingly, a second initial trench 250 can, in one or more embodiments, be formed in the second direction by etching through: the second hard mask material 248 of the second stack; the second conductive material 246 of the second stack; the third electrode material 224; and where the second initial trench 250 ends on the second electrode material 220.

The second sealing material 254 can, in one or more embodiments, be formed on the second hard mask material 248 remaining on the second conductive material 246 and sidewalls of the second initial trench 250 to a depth of the second initial trench. The second completed trench 256 can, in one or more embodiments, be formed in the second direction by etching through: second sealing material 254 formed on a bottom of the second initial trench 250; the second electrode material 220; the first electrode material 216; and where the completed etch ends on the first conductive material 216.

In accordance with one or more embodiments of the present disclosure, an array of memory cells can include first conductive lines, e.g., at 214, formed in a first direction, e.g., in the x-direction, second conductive lines, e.g., at 246, formed in a second direction, e.g., in the y-direction, and memory cells, e.g., at 106, located at intersections of the first conductive lines, e.g., at 214, and the second conductive lines, e.g., at 246. In one or more embodiments, the memory cells, e.g., at 106, can include a select device structure comprising an active select device material 218 formed between a first electrode 216 and second electrode 220, a storage element comprising an active storage element material 222 formed between the second electrode 220 and a third electrode 224. In one or more embodiments, the first conductive lines can be word lines and the second conductive lines can be bit lines.

A first sealing material 232 can be formed on sidewalls of one of the active select device material 218 and the active storage element material 222 in the first direction, e.g., in the x-direction, and a second sealing material 254 can be formed on sidewalls of the one of the active select device material 218 and the active storage element material 222 in the second direction, e.g., in the y-direction. In one or more embodiments, the first sealing material 232 can be formed on the sidewalls of the one of the active select device material 218 and the active storage element material 222 in the first direction.

In one or more embodiments, the active select device material 218 can be an OTS and the active storage element material 222 can be a PCM. Alternatively or in addition, the active select device material 218 can be an OTS and the active storage element material 222 can be a chalcogenide.

Another example of an array of memory cells can include first conductive lines, e.g., at 214, formed in the first direction, second conductive lines, e.g., at 246, formed in the second direction, and resistive memory cells, e.g., at 106, located at intersections of the first conductive lines and the second conductive lines. In one or more embodiments, the resistive memory cells, e.g., at 106, can include an OTS 218, a resistive storage element 222, which includes a PCM, formed between a first electrode 216 and a second electrode 220, the second electrode 220 being shared by the OTS 218 and the resistive storage element 222. In one or more embodiments, a first sealing material 232 can be formed on sidewalls of an active material of the OTS 218 in the first direction and a second sealing material 254 can be formed on sidewalls of the active material of the OTS 218 in the second direction.

The first sealing material 232 and the second sealing material 254 can, in one or more embodiments, be formed on the sidewalls of the active material of the OTS 218 by being deposited to a thickness of not greater than about 5 nm by a process selected from ALD and CVD. In one or more embodiments, the first sealing material 232 and the second sealing material 254 formed on the sidewalls of the OTS 218 are formed from one or more dielectric materials selected from a group that includes aluminum oxide ($Al_xO_y$), silicon nitride ($Si_3N_4$), silicon dioxide ($SiO_2$), among other dielectric materials. The first sealing material 232 and the second sealing material 254 can, in one or more embodiments, be formed on the sidewalls of the OTS 218 from the same sealing material.

FIG. 2M illustrates the array structure 210 of FIG. 2L subsequent to formation of a dielectric material 262 thereon. The dielectric material 262 can be a dielectric nitride and/or oxide material, for instance, and can be formed so as to fill the completed trenches 256. As such, in this example, the dielectric material 262 is formed on portions of the sealing material 254, the active material 218, the electrode material 216, and the conductive material 214 within the trenches 256. The dielectric material 262 formed in the trenches 256 can serve to isolate memory cells from each other, for instance.

FIG. 2N illustrates the array structure 210 of FIG. 2M subsequent to formation of a dielectric material 264 thereon. The dielectric material 264 can be an oxide material such as silicon dioxide ($SiO_2$), for instance; however, embodiments are not so limited. As an example, the oxide material 264 can serve to fill areas, e.g., cavities, within and/or outside the area in which the memory cells are located. Although not illustrated in FIGS. 2A-2N, conductive plugs can be formed, e.g., by filling vias formed in the array structure 210, to connect the conductive lines, e.g., 214 and 246, to other array circuitry, e.g., decode circuitry or other circuitry, which may be formed in substrate 212 or elsewhere. Such conductive plugs can be formed immediately prior to formation of the respective conductive materials 214 and 246 or after formation of the structure shown in FIG. 2N, for instance. As previously noted, additional arrays can be formed on the array structure 210 illustrated in FIGS. 2A-2N, e.g., to form a 3D stacked array architecture.

Forming an array such as described in FIGS. 2A-2N can provide benefits such as reducing or preventing contamination of active cell materials as compared to previous approaches. For instance, forming a sealing material within trenches, e.g., as part of a partial etching process, can passivate active cell materials, e.g., active select device materials and/or active storage element materials, during deepening of the trenches.

Although each of the materials in the stack of materials 210 illustrated in FIGS. 2A-2N is shown to be formed in a series, e.g., laminated in layers, one or more of the illustrated series of materials may be excluded without departing from the scope of the present disclosure. That is, various structural features are grouped together in one or more illustrated embodiments for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of the one or more embodiments illustrated in FIGS. 2A-2N. Thus, the following claims are hereby incorporated into the Detailed Description, with each claim standing on its own as a separate embodiment.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion and not a restrictive one. Combination of the above embodiments, and other embodiments not specifically described herein, will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An array of memory cells, comprising:
   a first stack of materials formed on a first conductive material;
   first trenches in the first stack formed through the first stack in a first direction, wherein the first trenches comprise:
      a plurality of initial trenches in the first direction formed through a first portion of the first stack;
      a sealing material formed on sidewalls of the plurality of initial trenches; and
      a plurality of completed trenches in the first direction formed through a remaining portion of the first stack and the first conductive material, wherein:
         at least a partial depth of the completed trenches has exposed sidewalls without the sealing material thereon; and
   a second stack of materials formed on the first stack and comprising:
      second trenches formed through the second stack and at least a first portion of the first stack in a second direction, wherein the second trenches comprise a sealing material formed on sidewalls of the second trenches in the second direction.

2. The array of claim 1, further comprising:
   a plurality of initial trenches in the second direction formed through the second stack and the at least a first portion of the first stack; and
   a plurality of completed trenches in the second direction formed through at least a second portion of the first stack wherein at least a partial depth of the completed trenches has exposed sidewalls without the sealing material thereon.

3. The array of claim 1, wherein first conductive lines corresponding to the memory cells are formed by the plurality of completed trenches in the first direction.

4. The array of claim 2, wherein the plurality of completed trenches in the second direction ends on the first conductive material corresponding to the first conductive lines.

5. The array of claim 1, wherein the first stack includes:
   an active select device material formed between a first electrode material and a second electrode material; and
   an active resistive storage element material formed between the second electrode material and a third electrode material.

6. The array of claim 5, wherein:
   the active select device material, the first electrode material, and the second electrode material corresponds to an ovonic threshold switch (OTS); and
   the active resistive storage element material, the second electrode material and the third electrode material correspond to a phase change storage element.

7. The array of claim 5, wherein the first electrode material is formed in contact with the first conductive material.

8. The array of claim 7, wherein the sealing material formed on the sidewalls of the initial trenches seal at least a portion of the active resistive storage element material.

9. The array of claim 5, wherein the third electrode material is formed in contact with the first conductive material.

10. The array of claim 9, wherein the sealing material formed on the sidewalls of the initial trenches seal at least a portion of the active select device material.

11. The array of claim 1, wherein the first stack of materials includes:
    an active select device material formed between a first electrode material and a second electrode material;
    an active resistive storage element material formed between the second electrode material and a third electrode material; and
    a second conductive material formed on the third electrode material.

12. The array of claim 1, wherein:
    the second stack of materials includes a second conductive material; and
    the second trenches formed through the second stack and at least a first portion of the first stack in the second direction are formed through the second conductive material to form second conductive lines.

13. An array of memory cells, comprising:
    first conductive lines formed in a first direction on a first conductive material;
    second conductive lines formed in a second direction; and
    a first stack of materials comprising:
       memory cells formed by first trenches and located at intersections of the first conductive lines and the second conductive lines, the memory cells comprising:
          a select device structure comprising an active select device material formed between a first electrode and second electrode;
          a storage element comprising an active storage element material formed between the second electrode and a third electrode;
          a first sealing material formed on sidewalls of one of the active select device material and the active storage element material in the second direction;
          a second sealing material formed on sidewalls of the one of the active select device material and the active storage element material in the first direction; and
    a second stack of materials formed on the first stack and comprising:
       second trenches formed through the second stack and at least a first portion of the first stack in the second direction, wherein the second trenches comprise a third sealing material formed on sidewalls of the second trenches in the second direction.

14. The array of claim 13, wherein the first sealing material is formed on the sidewalls of the one of the active select device material and the active storage element material in the first direction.

15. The array of claim 13, wherein the active select device material is an ovonic threshold switch (OTS).

16. The array of claim 15, wherein the active storage element material is a phase change material (PCM).

17. The array of claim 13, wherein the active select device material is an ovonic threshold switch (OTS) and the active storage element material is a chalcogenide.

18. The array of claim 13, wherein the first conductive lines are word lines and the second conductive lines are bit lines.

19. An array of memory cells, comprising:
- first conductive lines formed in a first direction on a first conductive material;
- second conductive lines formed in a second direction; and
- a first stack of materials comprising:
  - resistive memory cells formed by first trenches and located at intersections of the first conductive lines and the second conductive lines, the resistive memory cells comprising:
    - an ovonic threshold switch (OTS);
    - a resistive storage element comprising a phase change material (PCM) formed between a first electrode and a second electrode, the second electrode being shared by the OTS and the resistive storage element;
    - a first sealing material formed on sidewalls of an active material of the OTS in the first direction; and
    - a second sealing material formed on sidewalls of the active material of the OTS in the second direction; and
  - a second stack of materials formed on the first stack and comprising:
    - second trenches formed through the second stack and at least a first portion of the first stack in the second direction, wherein the second trenches comprise a third sealing material formed on sidewalls of the second trenches in the second direction.

20. The array of claim 19, wherein the first sealing material, the second sealing material, and the third sealing material formed on the sidewalls of the active material of the OTS are deposited to a thickness of not greater than about 5 nanometers by a process selected from atomic layer deposition (ALD) and conformal chemical vapor deposition (CVD).

* * * * *